United States Patent [19]

Takase et al.

[11] Patent Number: 5,311,464

[45] Date of Patent: May 10, 1994

[54] SEMICONDUCTOR MEMORY CELL FARMING A ROM CELL FROM A RAM CELL

[75] Inventors: Shinsuke Takase; Yutaka Tanaka, both of Yokohama, Japan

[73] Assignee: Kabushiki Kaisha Toshiba, Kanagawa, Japan

[21] Appl. No.: 707,915

[22] Filed: May 30, 1991

[30] Foreign Application Priority Data

Jun. 8, 1990 [JP] Japan ................. 2-148543

[51] Int. Cl.$^5$ ............................................. G11C 11/40
[52] U.S. Cl. ........................................ 365/156; 365/226
[58] Field of Search ............... 365/154, 156, 190, 184, 365/226

[56] References Cited

U.S. PATENT DOCUMENTS

| | | | |
|---|---|---|---|
| 4,095,281 | 6/1978 | Denes | 365/156 |
| 4,132,904 | 1/1979 | Harari | 365/156 |
| 4,618,943 | 10/1986 | Arpperspach et al. | 365/184 X |
| 4,939,691 | 7/1990 | Mizukami et al. | 365/189.01 |
| 5,051,952 | 9/1991 | Gotou | 365/154 |

FOREIGN PATENT DOCUMENTS

| | | |
|---|---|---|
| 54146935 | 1/1980 | Japan . |
| 55-160392 | 3/1981 | Japan . |
| 57-040797 | 6/1982 | Japan . |
| 58-094186 | 8/1983 | Japan . |
| 0130395 | 5/1989 | Japan . |

Primary Examiner—Seungsook Ham
Attorney, Agent, or Firm—Finnegan, Henderson, Farabow, Garrett & Dunner

[57] ABSTRACT

The present invention relates to a semiconductor memory cell. The memory cell comprises a word line, a pair of bit lines crossing the word line, a resistance having a first side connected to a high power source and a second side connected to a first connecting node, a first FET connected between the first connecting node and a low power source and having a gate connected to a second connecting node, a second FET connected between the second connecting node and the low power source and having a gate connected to the first connecting node, a third FET connected between the first connecting node and one of the pair of bit lines and having a gate connected to the word line to control the operation of the third FET by changing the potential of the word line, and a fourth FET connected between the second connecting node and the other of the pair of bit lines and having a gate connected to the word line to control the operation of the fourth FET by changing the potential of the word line.

11 Claims, 10 Drawing Sheets

SEMICONDUCTOR MEMORY CELL FARMING A ROM CELL FROM A RAM CELL

BACKGROUND OF THE INVENTION

1. Field of the Invention

This invention relates to a semiconductor memory cell which is capable of easily forming a read-only memory (ROM) cell from a random access memory (RAM) cell.

2. Description of the Prior Art

A gate array method as a design method or a development method for various kinds of custom LSIs is widely used because this gate array method has a short development period.

In the gate array method, a plurality of basic cells are arranged and secured to a chip. These basic cells are used for designing various kinds of random logic LSIs to reduce the development period.

In the gate array method, there are two methods of designing memory circuits which are commonly used.

In the first method, the basic cells are wired by using mask patterns (which have been registered in a library) to form various types of memory cells. The RAM and ROM cells can be formed as memory cells with different configurations because the memory cells used in the first method are a general purpose type memory cell.

However, the required areas of the RAM and ROM on the chip are increased because the configurations of the RAM and the ROM cells are wasteful and the wiring required in the RAM and ROM is relatively long.

Therefore, it is difficult to design an LSI by using the first method.

In the second method, special memory cells for various memory circuits are registered in the library, and a memory cell is designed by using the special memory cells.

By using the second method, the problems inherent in the first method (wasted area in the RAM and ROM cells) can be eliminated. However, the special memory cells such as the RAM cells and the ROM cells must be registered because the functions of the RAM and ROM cells are different.

Moreover, differrent capacity memory cells must be registered for the RAM cells and the ROM cells in the sercond method. There are, therefore, more kinds of memory cells than in the first method.

When a custom LSI incorporating memory circuits is designed by using the second method, special memory cells for required functions must be developed or the memory cells having such functions must be registered beforehand in a library, so that the design cost is increased.

SUMMARY OF THE INVENTION

This invention is provided to overcome the problem in the prior art described above.

An object of the present invention is to provide a semiconductor memory cell which is capable of easily forming memory cells of different functions, such as a RAM and a ROM, for example.

A semiconductor memory cell according to the present invention comprises a word line, a pair of bit lines crossing the word line, a resistance of one side of which is connected to a high power source and the other side to a first connecting node, a first field effect transistor (a first FET) connected between the first connecting node and a low power source and the gate of which is connected to a second connecting node, a second FET connected between the second connecting node and the low power source the gate of which is connected to the first connecting node, a third FET connected between the first connecting node and one of the pair of bit lines the gate of which is connected to the word line to control the operation of the third FET by changing the potential of the word line, and a fourth FET connected between the second connecting node and the other of the pair of bit lines the gate of which is connected to the word line to control the operation of the fourth FET by changing the potential of the word line.

Another preferred embodiment of a semiconductor memory cell according to the present invention, comprises a word line, a pair of bit lines crossing the word line, a first resistance of one side of which is connected to a high power source and the other side connected to a first connecting node, a second resistance of one side of which is connected to a high power source and the other side to a second connecting node, a first field effect transistor (a first FET) connected between the first connecting node and a low power source and the gate of which is connected to the low power source, a second FET connected between the second connecting node and the low power source the gate of which is connected to the low power source, a third FET connected between the first connecting node and one of the pair of bit lines the gate of which is connected to the word line to control the operation of the third FET by changing the potential of the word line, and a fourth FET connected between the second connecting node and the other of the pair of bit lines the gate of which is connected to the word line to control the operation of the fourth FET by changing the potential of the word line.

Another preferred embodiment of a semiconductor memory cell according to the present invention comprises, a word line, a pair of bit lines crossing the word line, a first resistance of one side of which is connected to a high power source and the other side of which is connected to a first connecting node, a second resistance one side of which is connected to a high power source and the other side to a second connecting node, a first field effect transistor (a first FET) connected between the first connecting node and a low power source the gate of which is connected to the high power source, a second FET connected between the second connecting node and the low power source the gate of which is connected to the high power source, a third FET connected between the first connecting node and one of the pair of bit lines and of which the gate is connected to the word line to control operation of the third FET by changing the potential of the word line, and a fourth FET connected between the second connecting node and the other of the pair of bit lines the gate of which is connected to the word line to control the operation of the fourth FET by changing the potential of the word line.

By the present invention, the design period or the development period of a semiconductor device such as a custom LSI having the semiconductor memory cells according to the present invention can be decreased and the degree of integration of the memory cell in a semiconductor device the memory circuits can be enhanced.

The object, features and advantages of the present invention will be more apparent from the following

DETAILED DESCRIPTION OF THE EMBODIMENTS

The preferred embodiments will be explained with reference to the drawings.

Figure 1:
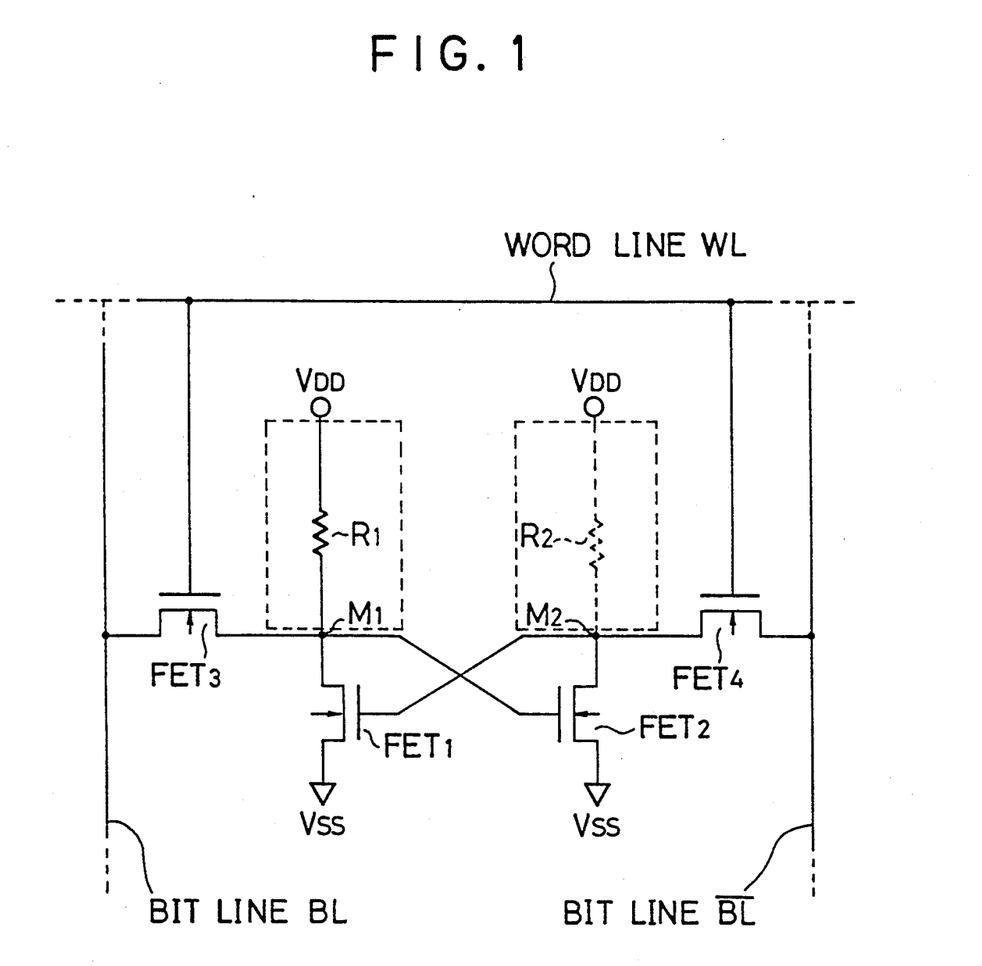
FIG. 1 is an electrical diagram as a configuration of a memory cell of a first embodiment according to the present invention.

FIG. 1 is an electrical diagram of a configuration of a memory cell of a first embodiment according to the present invention.

The memory cell is formed as one bit RAM by using a memory cell of a resistance load type which is widely used as a static RAM by a master slice method.

In the same diagram, a high resistance R1 is connected to an N channel conductivity type (an enhancement type) field effect transistor FET1, in series between a power source VDD and a power source (ground) VSS through a connection node M1. A high resistance R2 is connected to an N channel conductivity type (an enhancement type) field effect transistor FET2 in series between a power source VDD and a power source (ground) VSS through a connection node M2.

The connection node M1 is connected to gate of the FET2 and to a bit line BL through FET3, the gate of which is connected to a word line WL.

The connection node M2 is connected to gate of the FET1 and to a bit line $\overline{BL}$ through FET4, the gate of which is connected to a word line WL.

In the memory cell having the configuration described above, the high resistance R2 is disconnected from the power source VDD or the power source VSS to stop the function thereof.

Next, a write operation of the memory cell of the present embodiment is explained.

When the power VDD is turned on, the FET3 and the FET4 enter the inactivation state because the potential of the word line WL enters the low level. The potential of the connection node M1 goes to the high level, the potential of which is that of the power source VDD.

At the same time, the connection node M2 does not enter the high level because the connection node M2 is disconnected from the power source VDD.

Accordingly, the FET2 enters the active state and the connection node M2 enters the low level of which the potential is that of the power source (ground) VSS.

Thus, the information in one bit is stored in the memory cell because the FET1 enters the inactive state, the connection node M1 enter the high level of VDD and the connection node M2 enters the low level of VSS.

Next, a readout operation of the memory cell of the present embodiment will be explained.

When the word line WL enters the high level to activate FET3 and FET4, charges on the bit line $\overline{BL}$ flow into the power source (ground) VSS through FET2 and FET4 (both of which are in the active state), then the potential of the bit line $\overline{BL}$ enters the low state. On the other hand, the bit line $\overline{BL}$ maintains the high level because the FET1 is in the inactive state. In this case, both the bit lines BL and $\overline{BL}$ have been precharged at the high level.

The change in potential of each bit line can be detected by using a sense amplifier connected to the bit lines BL and $\overline{BL}$, for example.

Thus, the information in the memory cell can be read out as described above.

When the word line WL enters the low level after the readout operation of the memory cell, the FET3 and the FET4 enter the inactive states, so that the state of the connection nodes M1 and M2 are not changed. Namely, the information in the memory cell cannot be changed.

In this case, when the power is OFF, the connection nodes M1 and M2 enter the low level. However, when the power is again ON, the potentials of the connection node M1 is switched to the high level and the potential of the connection node M2 enters the low level in the same manner as described above, so that these connection nodes M1 and M2 can be maintained in the state preceding the cutting of the power.

Namely, the information in the memory cell can be maintained even if the power is OFF and the memory cell has the function of a ROM.

In the present embodiment, the ROM can be easily formed from the resistance load type memory cell as a RAM cell which is widely used in the prior art.

In the first embodiment, the high resistance R2 is disconnected from the power source VDD, the high resistance R1 may be disconnected from the VDD or the connection node M1 and the high resistance R2 may be connected to the power source VDD and the drain of the FET2. In this case, the operation of the memory cell is reversed to that of the memory cell of first embodiment, but the same effect can be obtained.

Figure 2:
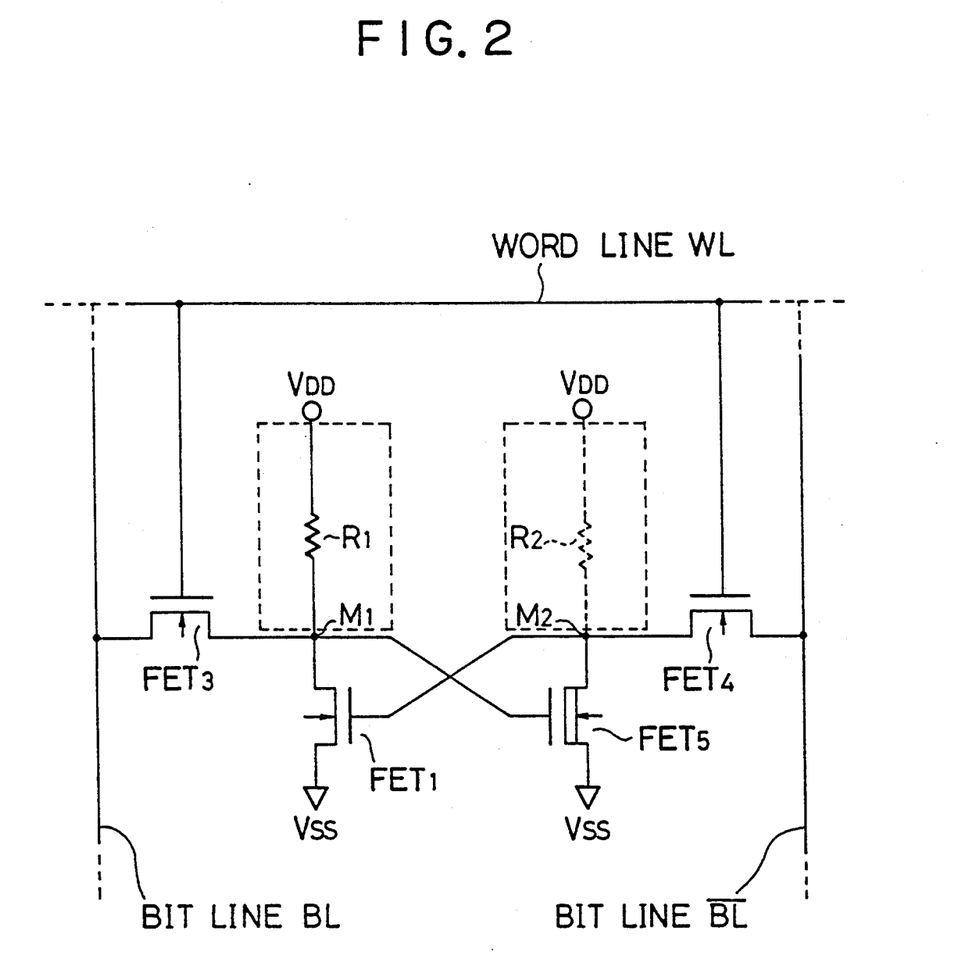
FIG. 2 is an electrical diagram as a configuration of a memory cell of a second embodiment according to the present invention.

FIG. 2 is an electrical diagram as a configuration of a memory cell of a second embodiment according to the present invention.

Compared with the memory cell of the first embodiment as shown in FIG. 1, FET5 shown in FIG. 2 consists of a depletion type FET1. The other elements are the same as those of FIG. 1.

Even if the connection node M1 has been at the low level when the power is ON, the FET5 enters the active state, so that the connection node M2 enters the low level of VSS (ground) and the FET1 enters the inactive state when the power is ON.

Thereby, the potentials of the connection nodes M1 and M2, as shown in FIG. 2, are determined faster than those of the connection nodes M1 and M2 as shown in FIG. 1.

The operation speed of the memory cell as shown in FIG. 2 can therefore be increased after the power is ON.

Figure 3:
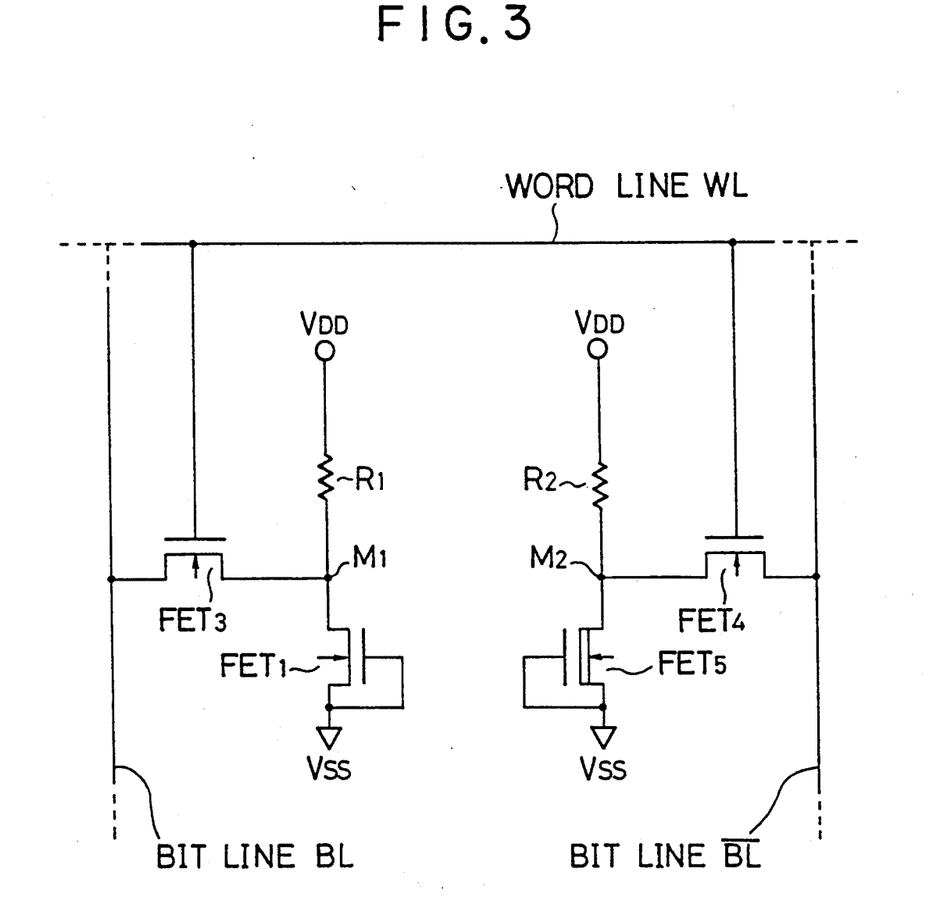
FIG. 3 is an electrical diagram as a configuration of of a memory cell of a third embodiment according to the present invention.

FIG. 3 is an electrical diagram of a configuration of of a memory cell of a third embodiment according to the present invention.

Compared with the first and the second embodiments, shown in FIGS. 1 and 2, in the memory cell of the third embodiment, the FET5 consists of a depletion type FET, which is provided between the connection node M2 and the power source (ground) VSS. Additionally, as in the embodiments shown in FIGS. 1 and 2, the resistance values of resistances R1 and R2 may be different from one another.

In addition, the gates of the FET1 and the FET5 are connected to the power source (ground) VSS. Thereby, the two bits of information can be stored in the connection nodes M1 and M2.

In the memory cell of the third embodiment having the configuration above described, the connection node M1 is kept in the high level because the FET1 can be maintained in the inactive state while the power is ON. On the other hand, the potential of the connection node M2 is kept in the low level because the FET5 can be maintained in the active state while the power is ON. Accordingly, two bits of information can be kept at the connection nodes M1 and M2.

In this case, when the power is OFF, the potential of the connection node M1 enters the low level. Then, when the power is again ON, the potential of the connection node M1 may recover to the high level.

As described above, as in the first and the second embodiments, the memory cell of the third embodiment can operate as a nonvolatile memory cell, for example a ROM.

Figure 4:
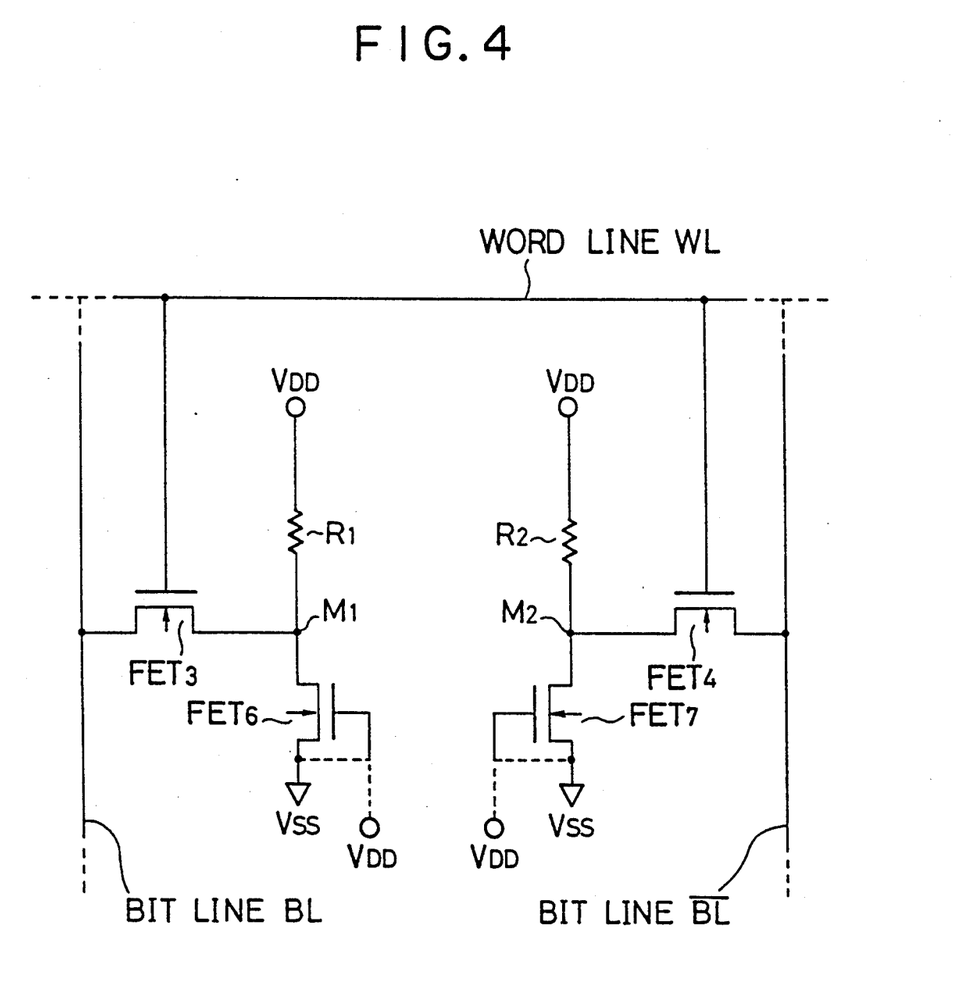
FIG. 4 is an electrical diagram as a configuration of a memory cell of a fourth embodiment according to the present invention.

FIG. 4 is an electrical diagram of a configuration of a memory cell of a fourth embodiment according to the present invention.

Compared with the memory cell of the third embodiment as shown in FIG. 3, each of the FET6 and the FET7 consists of an enhancement type FET. Each gate of the FET6 and the FET7 is connected to the power source VDD or the VSS (ground). Additionally, as in FIG. 3, the resistance values of resistances R1 and R2 may be different.

In the memory cell having the configuration described above, the potentials of the connection nodes M1 and M2 enter the low level when the gates of the FET6 and the FET7 are connected to the power source VDD. Conversely, the potentials of the connection nodes M1 and M2 enter the high level when the gates of the FET6 and the FET7 are connected to the power source (ground) VSS.

Thus, the memory cell of the fourth embodiment can store two bits of information in a manner similar to the memory cell of the third embodiment. Additionally, FET7 shown in FIG. 4 can be a depletion type FET.

Next is an explanation of the actual composite diagrams of the memory cells according to the first to fourth embodiments.

Figure 5:
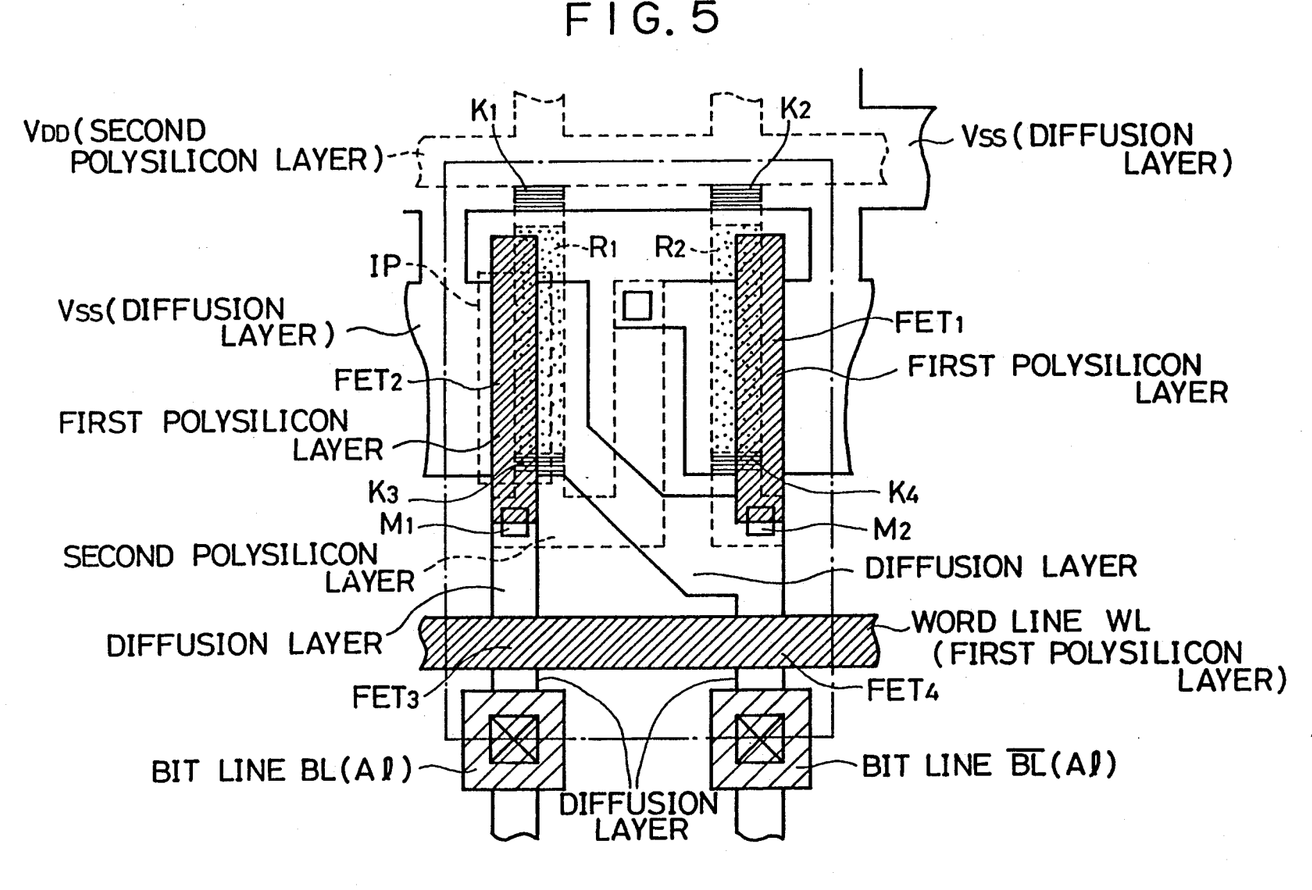
FIG. 5 is a composite layout (pattern layout) of the memory cell of the first embodiment as shown in FIG. 1.

FIG. 5 is a composite layout (pattern layout) of the memory cell of the first embodiment as shown in FIG. 1.

In the same diagram, the gates of FET3 and FET4 and the word line WL comprise a first polysilicon layer. Diffusion regions in the first polysilicon layers of the FET3 and the FET4 are connected to the bit lines BL and $\overline{BL}$ which consist of aluminum.

The gate of each of the FET1 and the FET2 consist of the first polysilicon layer. The source region of the FET1 and the FET2, and the power source VSS consist of a diffusion layer.

A drain region of the FET1 is connected to the connection node M1 through a wiring region which consists of a second polysilicon layer of low resistance doped with dopants such as impurities. The drain region of the FET2 is connected to the connection node M2 through a wiring region which consists of a diffusion layer.

The high resistances R1 and R2 consist of the second polysilicon layer. Another region of the high resistance regions R1 and R2 is doped with dopants and the power source VDD is formed on one side of the resistances R1 and R2, and the wiring regions are formed on the other side for the connection nodes M1 and M2.

In the composite layout as shown in FIG. 5, when one of the regions designated by the characters K1 and K3 of the second polysilicon layer of both side of the high resistance R1 and the regions designated by the characters K2 and K4 of the second polysilicon layer of both side of the high resistance R2 is not formed, the memory cell of the first embodiment as shown in FIG. 1 can be easily provided from the basic cell as the RAM in a short development period without increasing the fabrication processes.

The configuration of the memory cell as shown in FIG. 2 can be easily formed by doping with impurities in a region designated by a reference character IP as shown in FIG. 5. Thereby, the FET2 is changed to the depletion type FET5. The doping of the impurities can be operated by using a master slice method after the polysilicon and the aluminum layers are formed.

Similar to the memory cell shown in FIG. 1, the ROM can be formed from the basic cell of the RAM.

The doping step of the impurities can be provided in the diffusion step at which the FETs are formed.

Figure 6:
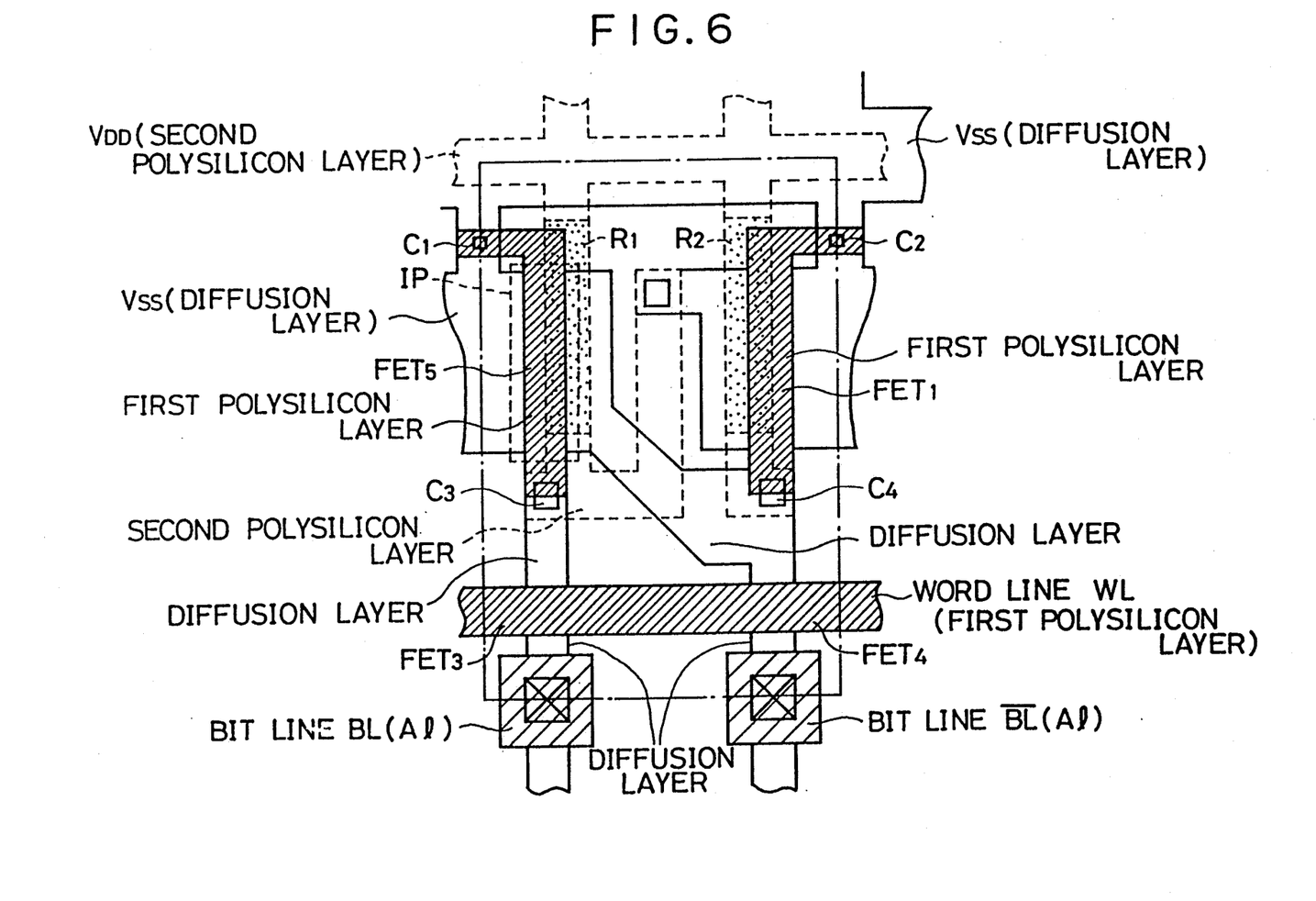
FIG. 6 is a composite layout (pattern layout) of the memory cell of the third embodiment as shown in FIG. 3.

FIG. 6 is a composite layout (pattern layout) of the memory cell of the third embodiment as shown in FIG. 3.

In the composite layout as shown in FIG. 6, no contact holes C3 amd C4 by which the gates of the FET1 and the FET5 consisting of the first polysilicon layer are connected to the connection nodes M1 and M2 are formed, and the gates of the FET1 and the FET5 are disconnected from the connection nodes M1 and M2. In addition, the side of the first polysilicon layer is formed at the side of the diffusion layer of the power source VSS, then the first polysilicon layer is connected to the diffusion layer through the contact holes C1 and C2.

Accordingly, the memory cell of the third embodiment as shown in FIGS. 3 and 6 can be easily formed according to the presence or absence of the contact holes C1, C2, C3, and C4.

Figure 7:
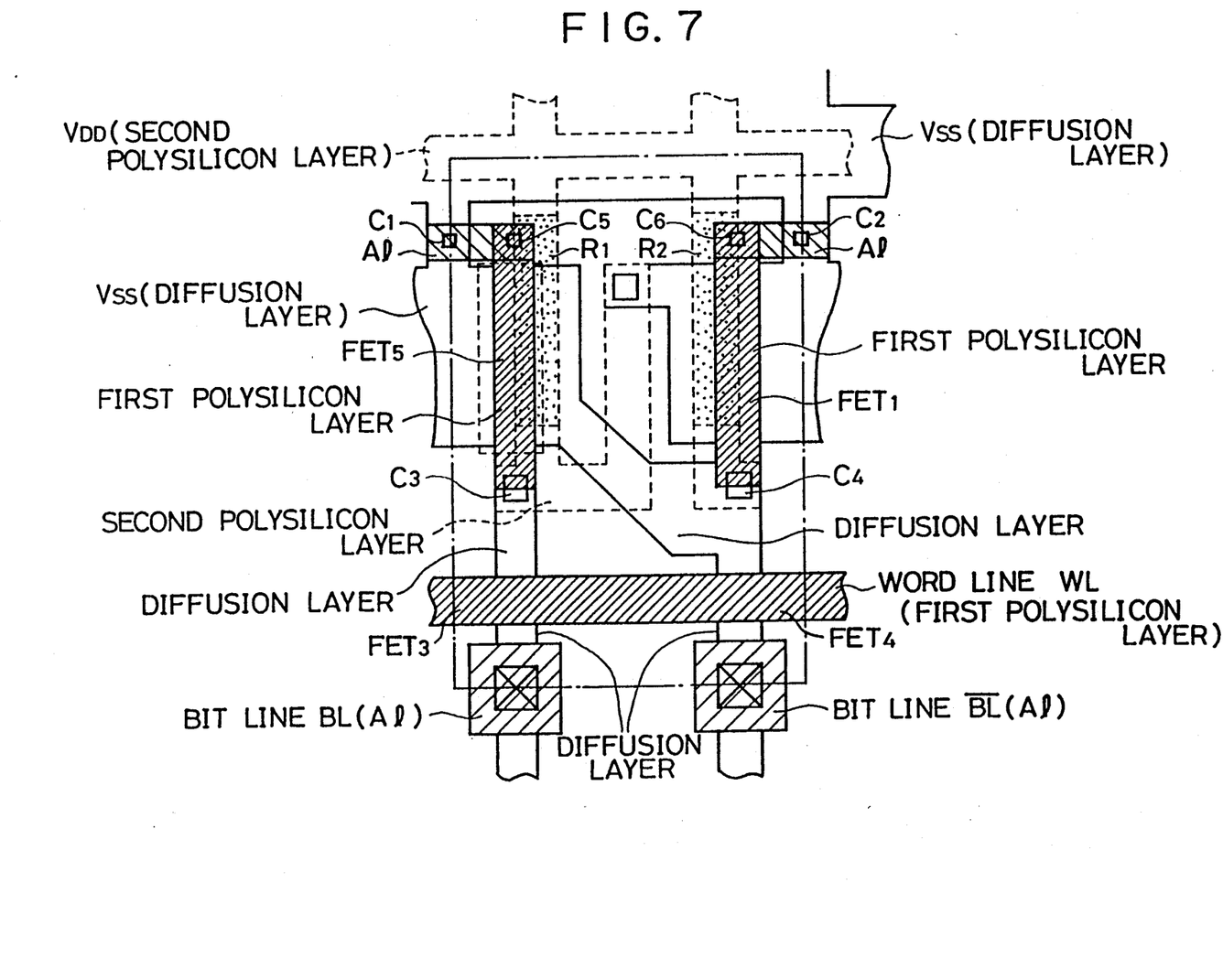
FIG. 7 is another composite layout (pattern layout) of the memory cell of the third embodiment as shown in FIG. 3.

FIG. 7 is another composite layout (pattern layout) of the memory cell of the third embodiment as shown in FIG. 3. Compared with the composite layout of the memory cell of the third embodiment as shown in FIG.

6, the composite layout (pattern layout) further comprises contact holes C5 and C6 by which the first polysilicon layer of the gates of the FET1 and the FET5 is connected to the power source (ground) VSS by the master slice method.

Thus, the memory cell as a ROM can be easily fabricated in the manner described above.

Figure 8:
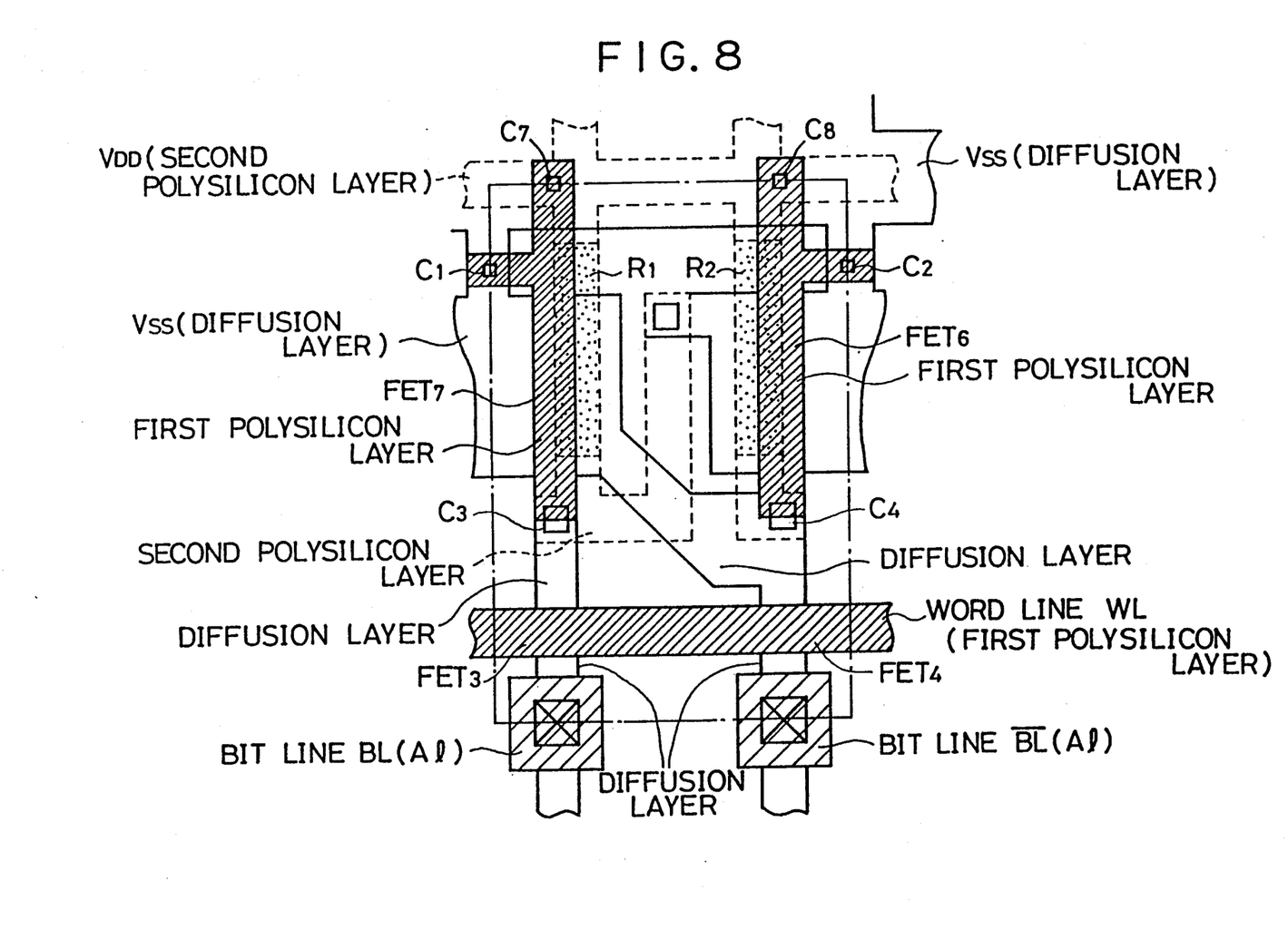
FIG. 8 is a composite layout (pattern layout) of the memory cell of the fourth embodiment as shown in FIG. 4.

FIG. 8 is a composite layout (pattern layout) of the memory cell of the fourth embodiment as shown in FIG. 4.

Compared with the composite layout of the memory cell of the third embodiment as shown in FIG. 6, the side portion of the first polysilicon layer as the gates of the FET1 and the FET2 is extended to the second polysilicon layer as the power source VDD. In addition, the first polysilicon layer as the gates of the FET1 and the FET2 and the diffusion layer as the power source VSS or the second polysilicon layer as the power source VDD are connected selectively to the contact holes C1, C2, C7, and C8.

Thereby, the memory cell of the fourth embodiment as shown in FIG. 4 can be easily formed according to the presence or absence of the contact holes C1, C2, C7, and C8.

Figure 9:
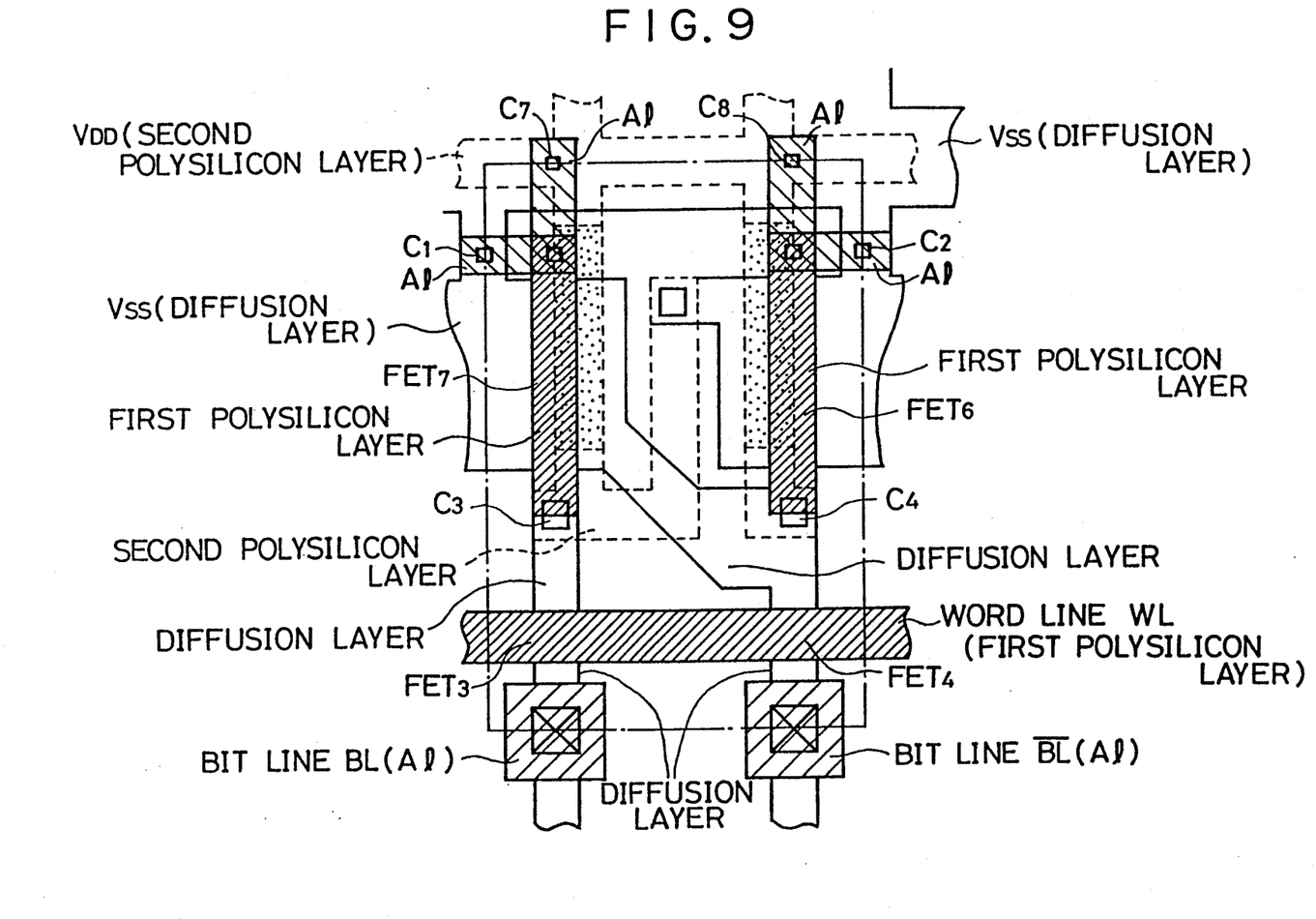
FIG. 9 is another composite layout (pattern layout) of the memory cell of the fourth embodiment as shown in FIG. 4.

FIG. 9 is another composite layout (pattern layout) of the memory call of the fourth embodiment as shown in FIG. 4. Compared with the composite layout of the memory cell as shown in FIG. 8. in the composite layout of the memory cell as shown in FIG. 9, the first polysilicon layer as the gates of the FET6 and the FET7 is connected selectively to the diffusion layer as the power source VSS or the second polysilicon layer as the power source VDD through the contact holes C1, C2, C7, and C8 which are preformed from aluminum wiring by the master slice method.

The memory cell of the fourth embodiment can be easily formed by the above manner.

As described above, the memory cells as the ROM having the composite layouts as shown in FIGS. 1 to 4 and FIGS. 5 to 9 can be easily fabricated in a relatively short period from the basic cells as the RAM.

Figure 10:
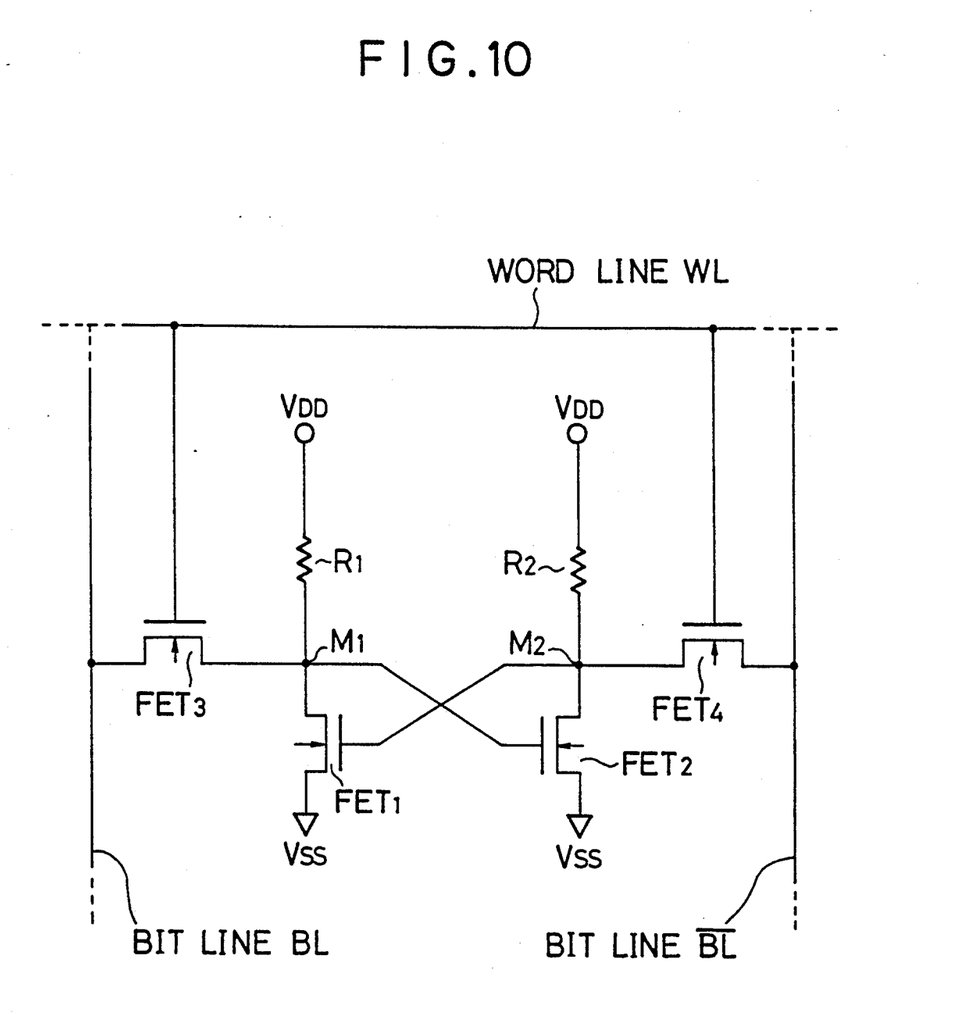
FIG. 10 is an electrical diagram of a high resistance load type memory cell of a fifth embodiment according to the present invention.

FIG. 10 is an electrical diagram of a high resistance load type memory cell of a fifth embodiment according to the present invention.

In the same diagram, the value of a resistance R1 differs from that of the resistance R2. The difference of the values of resistance R1 and R2 must be determined without losing the function of the memory cell as a RAM.

Thereby, the initial state of the memory cell can be provided.

The difference between the values of the resistances R1 and R2 can be provided by controlling the concentration of the doping impurities because the resistances R1 and R2 consist of the polysilicon layer.

Accordingly, for example, when the value of the resistance R1 is greater than that of the resistance R2, then the power is ON, the FET1 enters the active state, the FET2 enters the inactive state, the connection node M1 enters the low level and the connection node M2 enters the high level because the potential of the connection node M1 becomes lower than that of the connection node M2.

Accordingly, when the power is ON, the second information in the memory cell is never destroyed because the states described above can be set as the initial state of the memory cell.

Various modifications will become possible for those skilled in the art after the teaching of the present disclosure without departing from the scope thereof.

What is claimed is:

1. A semi-conductor memory cell having a plurality of memory cells, each comprising:
    a word line;
    a pair of bit line crossing the word line;
    a first resistance having a first side connected to a high power source and a second side connected to a first connecting node;
    a second resistance having a first side connected to a high power source and a second side connected to a second connecting node;
    a first field effect transistor (FET) connected between the first connecting node and a low power source and having a gate is connected to a second connecting node;
    a second FET connected between the second connecting node and the lower power source and having a gate connected to the first connecting node;
    a third FET connecting between the first connecting node and one of the pair of bit lines and having a gate connected to the word line to control the operation of the third FET by changing a potential of the word line; and
    a fourth FET connected between the second connecting node and the other of the pair of bit lines and having a gate connected to the word line to control the operation of the fourth FET by changing the potential of the word line,
    wherein a resistance value of the first resistance is an infinite value, the first FET is a depletion type FET and the second FET is an enhancement type FET.

2. A semiconductor memory cell comprising:
    a word line;
    a pair of bit lines crossing the word line;
    a first resistance having a first side connected to a high power source and having a second side connected to a first connecting node;
    a second resistance having a first side connected to a high power source and having a second side connected to a second connecting node;
    a first field effect transistor (FET) connected between the first connecting node and a low power source and having a gate connected to the low power source;
    a second FET connected between the second connecting node and the low power source and having a gate connected to the low power source;
    a third FET connected between the first connecting node and one of the pair of bit lines and having a gate connected to the word line to control the operation of the third FET by changing a potential of the word line; and
    a fourth FET connected between the second connecting node and the other of the pair of bit lines and having a gate connected to the word line to control the operation of the fourth FET by changing the potential of the word line.

3. A semiconductor memory cell comprising:
    a word line;
    a pair of bit lines crossing the word line;
    a first resistance having a first side connected to a high power source and having a second side connected to a first connecting node;

a second resistance having a first side connected to the high power source and having a second side connected to a second connecting node;

a first field effect transistor (FET) connected between the first connecting node and a low power source and having a gate directly connected to the high power source;

a second FET connected between the second connecting node and the lower power source and having a gate directly connected to the high power source;

a third FET connected between the first connecting node and one of the pair of bit lines and having a gate connected to the word line to control the operation of the third FET by changing a potential of the word line; and a fourth FET connected between the second connecting node and the other of the pair of bit lines and having a gate connected to the word line to control the operation of the fourth FET by changing the potential of the word line.

4. The semiconductor memory cell according to claim 3, wherein a threshold voltage of the first FET differs from a threshold voltage of the second FET.

5. The semiconductor memory cell according to claim 2, wherein a threshold voltage of the first FET differs from of the second FET.

6. The semiconductor memory cell according to claim 2, wherein the first FET is a depletion type FET and the second FET is an enhancement type FET.

7. The semiconductor memory cell according to claim 3, wherein a threshold voltage of the first FET differs from a threshold voltage of the second FET.

8. The semiconductor memory cell according to claim 3, wherein the first FET is a depletion type FET and the second FET is an enhancement type FET.

9. The semiconductor memory cell according to claim 2, wherein a resistance value of the first resistance differs from a resistance value of the second resistance.

10. A semiconductor memory cell according to claim 3, wherein the resistance value of the first resistance differs from that of the second resistance.

11. A semiconductor memory cell comprising:
a word line;
a pair of bit lines crossing the word line;
a resistance having a first side is connected to a high power source and a second side connected to a first connecting node;
a first effect transistor (FET) connected between the first connecting node and a low power source and having a gate connected to a second connecting node;
a second FET connected between the second connecting node and the low power source and having a gate connected to the first connecting node;
a third FET connected between the first connecting node and one of the pair of bit lines and having a gate connected to the word line to control the operation of the third FET by changing a potential of the word line; and
a fourth FET connected between the second connecting node and the other of the pair of bit lines and having a gate connected to the word line to control the operation of the fourth FET by changing the potential of the word line,
wherein the first FET is a depletion type FET and the second FET is an enhancement type FET.

* * * * *